US006233082B1

(12) United States Patent
Johnson

(10) Patent No.: US 6,233,082 B1
(45) Date of Patent: May 15, 2001

(54) OPTICAL TRANSMITTER FOR WDM SYSTEMS

(75) Inventor: John Evan Johnson, New Providence, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/416,323

(22) Filed: Oct. 12, 1999

(51) Int. Cl.$^7$ ................................................. G02B 26/00
(52) U.S. Cl. ................... 359/237; 359/124; 359/161; 359/115; 359/181; 359/182; 359/173; 385/3
(58) Field of Search .................... 359/237, 152, 359/173, 161, 124, 180, 181, 182, 187, 281; 385/3, 14

(56) References Cited

U.S. PATENT DOCUMENTS

| | | | |
|---|---|---|---|
| 5,325,225 | * 6/1994 | Suzaki et al. | 359/187 |
| 5,347,601 | * 9/1994 | Ade et al. | 385/3 |
| 5,365,361 | * 11/1994 | Noll et al. | 359/161 |
| 5,373,382 | * 12/1994 | Pirio et al. | 359/161 |
| 5,926,297 | * 7/1999 | Ishikawa et al. | 359/115 |
| 6,078,414 | * 6/2000 | Iwano | 359/124 |
| 6,141,140 | * 10/2000 | Kim | 359/281 |

* cited by examiner

Primary Examiner—Loha Ben
(74) Attorney, Agent, or Firm—Michael J. Urbano

(57) ABSTRACT

An optical transmitter for generating any one of N carrier signals for use in an M-channel WDM system (M≧N), each channel operating at a different carrier wavelength $\lambda_s$ (s=1, 2 ... M), includes an optical source for generating the carrier signals at any one of multiplicity of N wavelengths $\lambda_i$ (i=1, 2 ... N), where (1≦N≦M). A first controller selects a particular one of the wavelengths $\lambda_i$ at which the source operates. An optical modulator receives the carrier signal corresponding to the selected wavelength $\lambda_i$ and impresses information on the received signal. The modulator has a characteristic electronic bandgap and a wavelength $\lambda_g$ corresponding thereto. At a given temperature, $\lambda_g$ is offset from each $\lambda_i$ by an amount $\Delta\lambda_i$. For each wavelength $\lambda_i$ there is a predetermined value of $\Delta\lambda_i$ which delivers preferred (e.g., optimum) transmission performance. In general, however, the actual $\Delta\lambda_i$ may not be equal to the predetermined $\Delta\lambda_i$ for all values of i. The difference between the actual $\Delta\lambda_i$ and the predetermined $\Delta\lambda_i$ is termed the detuning error. In accordance with one aspect of my invention, the transmitter includes a second controller for minimizing the detuning error. In a preferred embodiment, the second controller changes the temperature of the modulator as the wavelength of the source is changed (i.e., as different $\lambda_i$ are selected) so that $\Delta\lambda_i$ is controlled according to the above criterion. In one embodiment, in which the wavelength of the source can be tuned independent of the temperature of the modulator, the second controller maintains the detuning error essentially zero for all values of i selected. In another embodiment, in which the wavelength of source is not tuned independent of the temperature of the modulator, $\lambda_i$ is detuned from $\lambda_s$ by a predetermined amount related to the rate of change of $\lambda_i$ and $\lambda_g$ with respect to temperature.

18 Claims, 4 Drawing Sheets

US 6,233,082 B1

OPTICAL TRANSMITTER FOR WDM SYSTEMS

FIELD OF THE INVENTION

This invention relates generally to optical transmitters and, more particularly, to laser-based transmitters for use in wavelength division multiplexed (WDM) systems.

BACKGROUND OF THE INVENTION

In optical transmitters that utilize semiconductor lasers as the optical source, the laser may be either directly modulated or externally modulated. In the directly modulated case the drive current to the laser is modulated in accordance with an information signal in order to produce a corresponding modulation of a parameter (e.g., intensity) of the output beam of the laser. In the externally modulated case the laser is operated in a continuous wave (cw) mode, and the output beam of the laser is coupled to an optical modulator that is external to the laser. An information signal is applied to the modulator so as to modulate a parameter of the output beam.

In a typical externally modulated optical transmitter the modulator is a semiconductor electroabsorption (EA) modulator. The EA modulator relies on the Quantum-Confined Stark Effect (in MQW semiconductors) or the Franz-Keldysh Effect (in bulk semiconductors) to alter the absorption of the laser beam. That is, a voltage bias applied to the EA modulator causes the bandgap of the modulator to shift relative to the wavelength of the beam which, in turn, changes the absorption of the beam.

The difference between the wavelength of the laser beam and the wavelength corresponding to the bandgap of the EA modulator is defined as the detuning. Detuning controls many important transmission parameters such as output power, extinction ratio and dynamic chirp of the modulator.

In a single wavelength transmitter, such as a monolithically integrated DFB laser/EA modulator, detuning is tightly controlled by the design of the devices; e.g., by varying the bandgap of the EA modulator during epitaxial growth to match the desired DFB wavelength on a particular wafer. One or two nanometers of variability can be compensated by adjusting the voltage bias to the modulator. The adjustment range is limited, however, by the voltage at which the EA modulator characteristics become degraded.

In WDM systems the transmitter is modified so that it is capable of generating an output beam at a any one of a multiplicity of wavelengths. One such modification is to replace the single-channel DFB laser with either a broadband wavelength selectable laser (WSL), such as a tunable DBR laser, or an array of DFB lasers coupled to a passive combiner network. In this case, however, the detuning of each channel wavelength from the EA modulator bandgap would be different from channel to channel, with the undesirable consequence that the transmission performance of each channel would be different.

SUMMARY OF THE INVENTION

An optical transmitter for generating any one of N carrier signals for use in an M-channel WDM system (M≧N), each channel operating at a different carrier wavelength $\lambda_s$ (s=1, 2 ... M), includes an optical source for generating the carrier signals at any one of multiplicity of N wavelengths $\lambda_i$ (i=1, 2 ... N), where (1≦N≦M). A first controller selects a particular one of the wavelengths $\lambda_i$ at which the source operates. An optical modulator receives the carrier signal corresponding to the selected wavelength $\lambda_i$ and impresses information on the received signal. The modulator has a characteristic electronic bandgap and a wavelength $\lambda_g$ corresponding thereto. At a given temperature, $\lambda_g$ is offset from each $\lambda_i$ by an amount $\Delta\lambda_i$. For each wavelength $\lambda_i$ there is a predetermined value of $\Delta\lambda_i$ which delivers preferred (e.g., optimum) transmission performance. In general, however, the actual $\Delta\lambda_i$ may not be equal to the predetermined $\Delta\lambda_i$ for all values of i. The difference between the actual $\Delta\lambda_i$ and the predetermined $\Delta\lambda_i$ is termed the detuning error. In accordance with one aspect of my invention, the transmitter includes a second controller for minimizing the detuning error. In a preferred embodiment, the second controller changes the temperature of the modulator as the wavelength of the source is changed (i.e., as different $\lambda_i$ are selected) so that $\Delta\lambda_i$ is controlled according to the above criterion. In one embodiment, in which the wavelength of the source can be tuned independent of the temperature of the modulator, the second controller maintains the detuning error essentially zero for all values of i selected. In another embodiment, in which the wavelength of source is not tuned independent of the temperature of the modulator, $\lambda_i$ is detuned from $\lambda_s$ by a predetermined amount related to the rate of change of $\lambda_i$ and $\lambda_g$ with respect to temperature.

BRIEF DESCRIPTION OF THE DRAWING

My invention, together with its various features and advantages, can be readily understood from the following more detailed description taken in conjunction with the accompanying drawing, in which.

In the interest of clarity and simplicity, FIGS. 1–4 & 7 have not been drawn to scale. In addition, when describing physical or optical dimensions, the symbol A stands for Angstroms, whereas when describing electric current, it stands for Amperes.

DETAILED DESCRIPTION OF THE INVENTION

General Design Considerations

In an M-channel WDM system, typically M optical transmitters are utilized to generate separate ones of the required M optical carrier signals each at a different wavelength $\lambda_s$ (s=1, 2 ... M), one per channel. If M is relatively large, each transmitter may be capable of generating any one of only a small subset N of the desired wavelengths (one wavelength at a time). In this case a multiplicity of such transmitters, each capable of generating a different subset of wavelengths (one wavelength per transmitter at a time), may be used to cover the entire channel spectrum. As a practical matter WSLs are a preferred way to provide this multi-wavelength function since they reduce the number of spare parts that must be kept on hand to replace failed transmitters.

Figure 1:
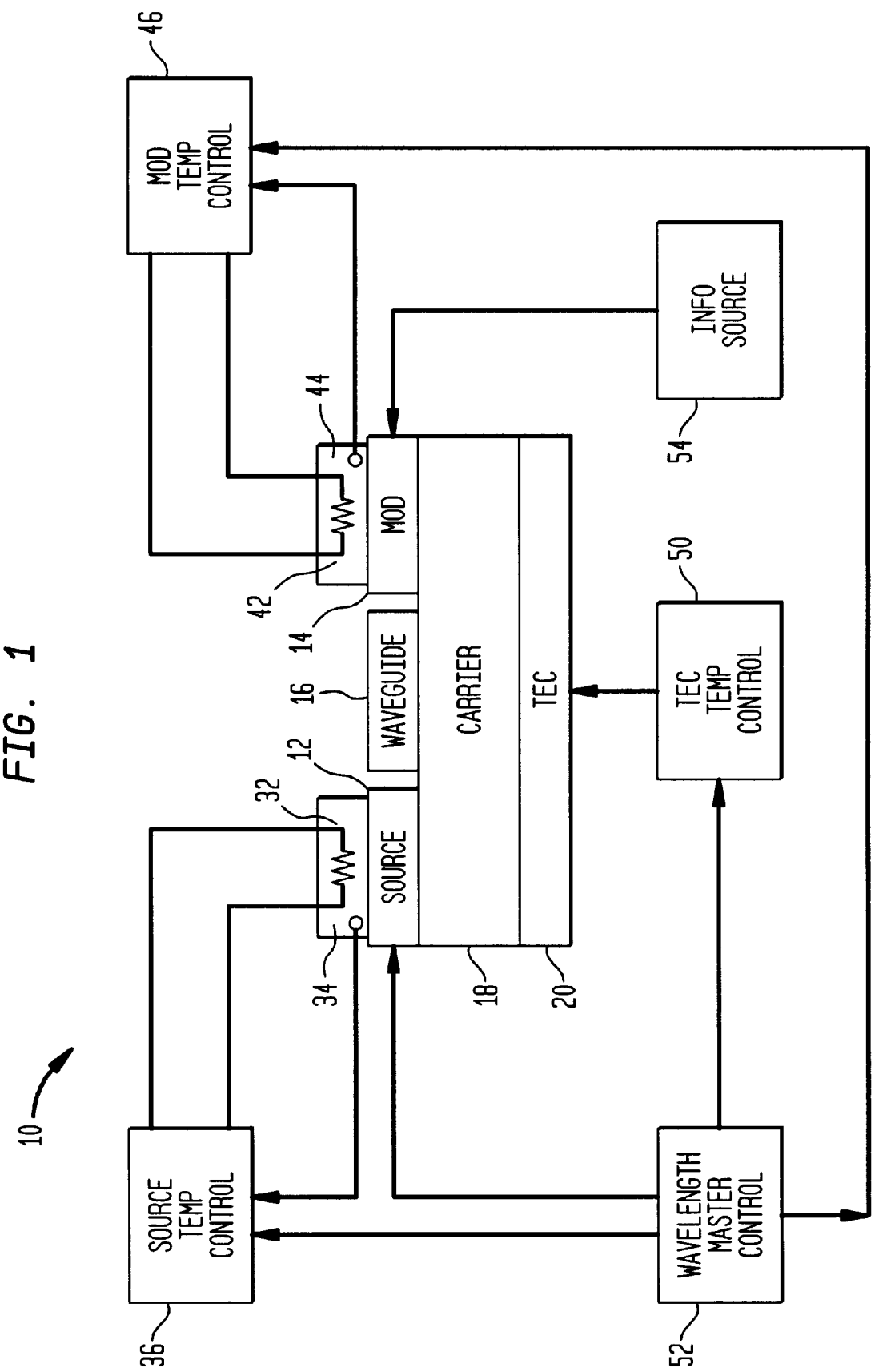
FIG. 1 is a schematic, block diagrammatic view of an optical transmitter in accordance with one embodiment of my invention in which the source and modulator are thermally coupled to one another via a common thermoelectric cooler (TEC)

In accordance with one embodiment of my invention, an optical transmitter for use in such a WDM system is shown in FIG. 1. Illustratively, the transmitter 10 includes an optical source 12 coupled to an optical modulator 14 via a optical waveguide 16. The source 12 generates an optical beam, typically a laser beam, that is guided by the waveguide 16 to the modulator 14. In a typical optical system, the output of the modulator would be coupled to a utilization device (not shown) The latter may include, for example, one or more of the following: a transmission medium such as an optical fiber, an optical isolator, an optical amplifier, an optical receiver, a piece of terminal equipment, an optical multiplexor, an optical circulator, etc.

Alternatively, the source, waveguide and modulator may be formed as an optical integrated circuit; for example, as an electroabsorption modulated laser (EML). An EML is typically an InP/InGaAsP semiconductor optical integrated circuit that includes a DFB laser, an optical waveguide and an EA modulator arranged in tandem.

An information source 54 (illustratively including a drive circuit and bias source, not shown) is coupled to the modulator in order to modulate the output beam of the source 12 in accordance with information (e.g., voice, data, video and/or signaling information) to be transmitted.

The source 12 may take on a variety of forms, but in WDM applications it is typically a well known tunable laser (e.g., a DBR laser) or a well known array of single-frequency lasers (e.g., DFB lasers) coupled to the waveguide/modulator via a well known passive network. An illustrative broadband tunable laser is described by L. E. Adams et al. in application Ser. No. 08/954,305 filed on Oct. 17, 1997 and assigned to the assignee hereof. This application, which is designated Adams et al. 1-16-1-6-5-2-11-57, is incorporated herein by reference. In an M-channel WDM system, the source 12 is capable of generating a carrier signal (e.g., a laser beam) at any one of multiplicity of N wavelengths $\lambda_i$ (i=1, 2 ... N), where ($1 \leq N \leq M$). A master controller 52 selects a particular one of the wavelengths $\lambda_i$ at which the source operates. The source may also include a well-known feedback arrangement for locking the source wavelength to the system wavelength, as selected by the master controller 52. The master controller also controls a number of other controllers 36, 46 and 50, one or more of which may be used in various embodiments of my invention.

In accordance with one embodiment of my invention, the source and modulator are thermally coupled to TEC 20 via a high thermal conductivity carrier 18. Thus, the temperature of the source and modulator are not totally independent of one another. More specifically, the minimum temperature of the source and modulator is controlled by TEC 20 and controller 50. In contrast the incremental, local temperature of the source is controlled by heater 32 and controller 36, whereas the incremental, local temperature of the modulator is controlled by heater 42 and controller 46. On the other hand, if there is sufficient thermal resistance between the source and modulator, the common TEC 20 in conjunction with only one of the controllers 36 or 46 may be used to separately control the local temperatures of the source and modulator. For example, if controller 36 and heater 32 are not present, the source temperature is controlled only by the TEC 20 and controller 50, whereas the minimum modulator temperature is controlled by TEC 20 and controller 50 and its incremental, local temperature is controlled by heater 42 and controller 46.

These controllers 36 and 46 provide electric current to heating elements 32 and 42, respectively, that are located in close proximity to the source 12 and modulator 14, respectively. Temperature sensors 34 and 44 provide feedback signals to controllers 36 and 46 corresponding to the temperatures of the source 12 and modulator 14, respectively.

Figure 2:
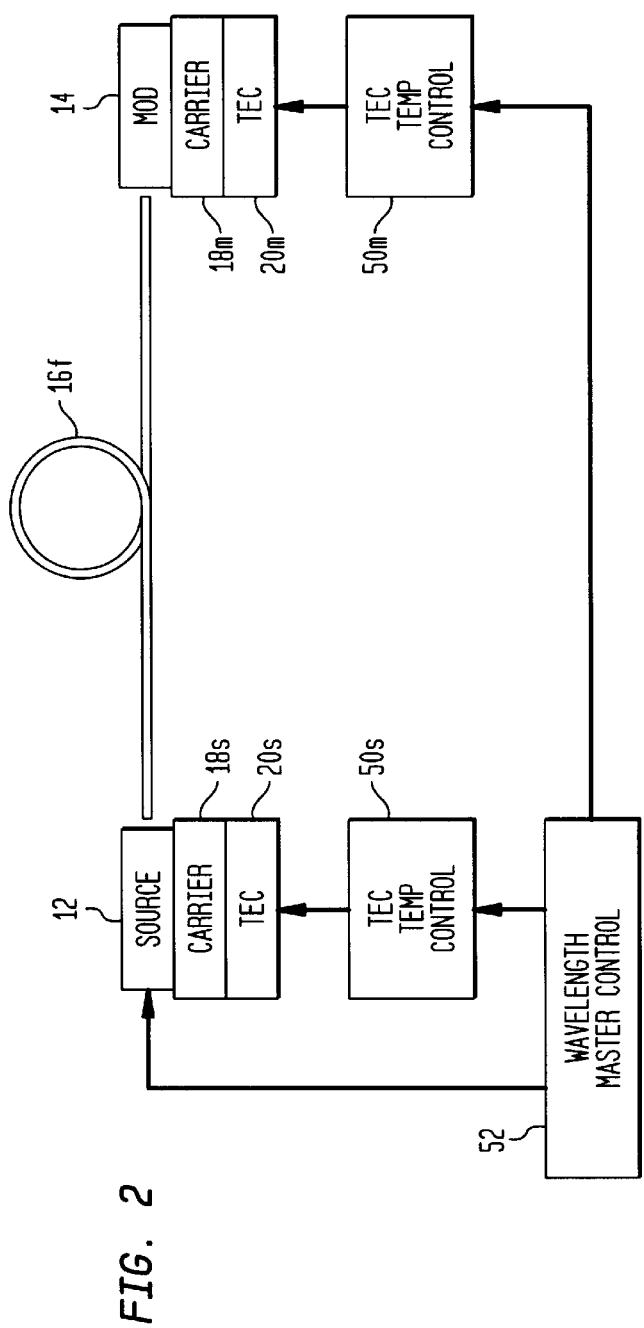
FIG. 2 is a schematic, block diagrammatic view of an optical transmitter in accordance with another embodiment of my invention in which the source and modulator are thermally coupled to separate TECs.

Note, however, the source and modulator need not be mounted on the same carrier; they may be discrete devices that are not thermally coupled to the same TEC/controller, so that the temperature of the source and modulator may be controlled independent of one another. FIG. 2 illustrates such an arrangement in which source 12 is thermally coupled to TEC 20s via carrier 18s, whereas modulator 14 is thermally coupled to TEC 20m via carrier 18m. Separate temperature controllers 50s and 50m control the temperature of the source and modulator, respectively, and are responsive to master controller 52. In this design the transmission medium is typically an optical fiber 16f, and the source and modulator components are packaged separately. That is, one package includes the source subassembly (source 12, carrier 18s and TEC 20s), whereas the other package includes the modulator subassembly (modulator 14, carrier 18m and TEC 20m).

Detuning Considerations

At a given temperature, $\lambda_g$ is offset from each $\lambda_i$ by an amount $\Delta\lambda_i$. For each wavelength $\lambda_i$ there is a predetermined value of $\Delta\lambda_i$ which delivers preferred (e.g., optimum) transmission performance. In general, however, the actual $\Delta\lambda_i$ may not be equal to the predetermined $\Delta\lambda_i$. As noted earlier, the difference between the actual $\Delta\lambda_i$ and the predetermined $\Delta\lambda_i$ for each channel is termed the detuning error for that channel. In accordance with one aspect of my invention, the transmitter includes one or more controllers for minimizing the detuning error for each channel.

In one embodiment (e.g., as shown in FIG. 2), in which the wavelength of source can be temperature tuned independent of the temperature of the modulator, the controller maintains the detuning error essentially zero for all values of i selected. In this case, as the wavelength of the source is changed from one channel to an adjacent one (i.e., the source wavelength changes by $\Delta\lambda_s$, the bandgap of the modulator is shifted by changing its temperature by an amount given by equation (1):

$$\Delta T = (dT/d\lambda_g)(\Delta\lambda_s + \Delta\lambda_i - \Delta\lambda_{i+1}) \qquad (1)$$

In another embodiment (as shown in FIG. 1), in which the wavelength of source is temperature tuned but not independent of the temperature of the modulator, the source wavelength $\lambda_i$ is detuned from the system wavelength $\lambda_s$ by a predetermined amount related to the rate of change of $\lambda_i$ and $\lambda_s$ with respect to temperature in such a way as to minimize the range of detuning errors; that is, $$\Delta\lambda_{i+1}(T_i)-\Delta\lambda_i(T_i)=\Delta\lambda_s[1-(\partial\lambda_i/\partial T)(\partial T/\partial\lambda_g)]+(d\lambda_i/dT)(dT/d\lambda_g)(\Delta\lambda_{i+1}-\Delta\lambda_i) \quad (2)$$

In one case the predetermined detuning is essentially the same for all channels; that is, $$\Delta\lambda_1 \approx \Delta\lambda_2 \approx \Delta\lambda_3 \ldots \approx \Delta\lambda_N \quad (3)$$

In this case, equations (1) and (2) simplify to equations (4) and (5), respectively:

$$\Delta T=\Delta\lambda_s(\partial\lambda_g/\partial T) \quad (4)$$

$$\Delta\lambda_i=\Delta\lambda_s[1-(\partial\lambda_i/\partial T)(\partial T/\partial\lambda_g)] \quad (5)$$

EA Modulator Embodiment

Figure 3:
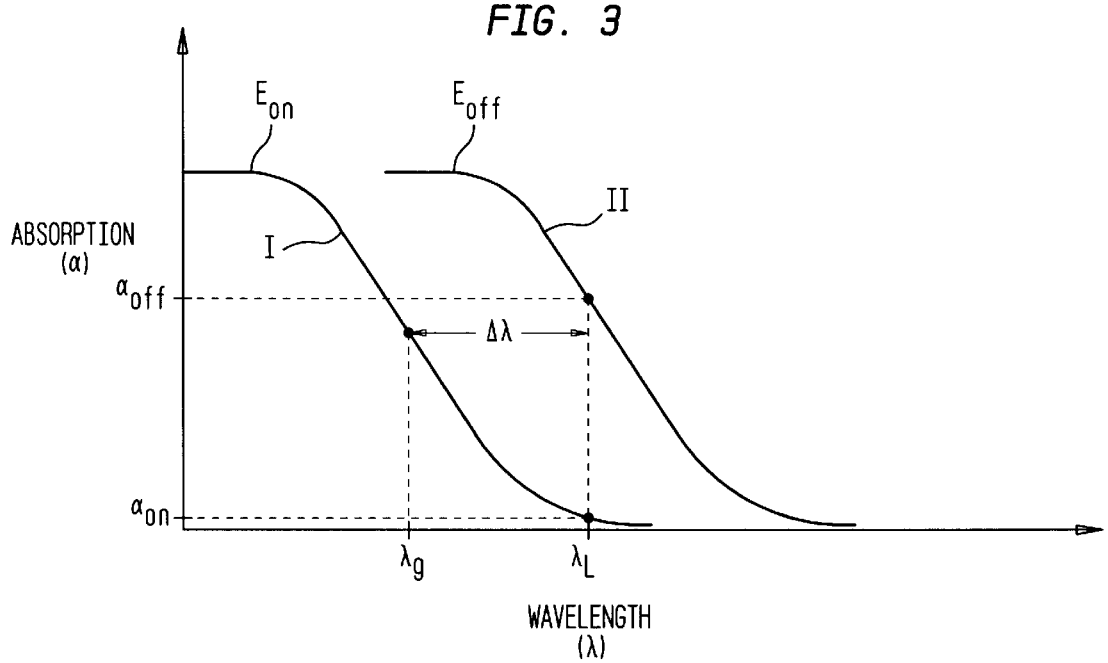
FIG. 3 is schematic graph of absorption vs. wavelength as a function of bias applied to an EA modulator.

In the discussion that follows it will be assumed that the modulator is an EA modulator for purposes of illustration only. However, other forms of modulator, especially semiconductor modulators may be suitable for use with my invention. With reference now to FIG. 3, the absorption ($\alpha$) of an EA modulator as a function of the optical wavelength of a beam propagating through the modulator is shown schematically. When the electric field across the modulator is relatively low (curve I, designated as $E_{on}$), the absorption of the beam at wavelength $\lambda_L$ is relatively low (designated as $\alpha_{on}$). Conversely, when the electric field across the modulator is relatively high (curve II, designated as $E_{off}$), the absorption characteristic shifts to higher wavelengths, and the absorption of the beam at wavelength $\lambda_L$ is relatively high (designated as $\alpha_{off}$). The fraction $\alpha_{off}/\alpha_{on}$ is known as the extinction ratio and is typically measured in dB. At a field of $E_{on}$ the wavelength difference $\Delta\lambda$ between $\lambda_L$ and the wavelength $\lambda_g$ corresponding the electronic bandgap of the modulator is, as noted earlier, designated as the offset or detuning. In general, $\Delta\lambda$ is optimized for low on-state loss at $E_{on}$ and high extinction ratio at $E_{off}$.

Figure 4:
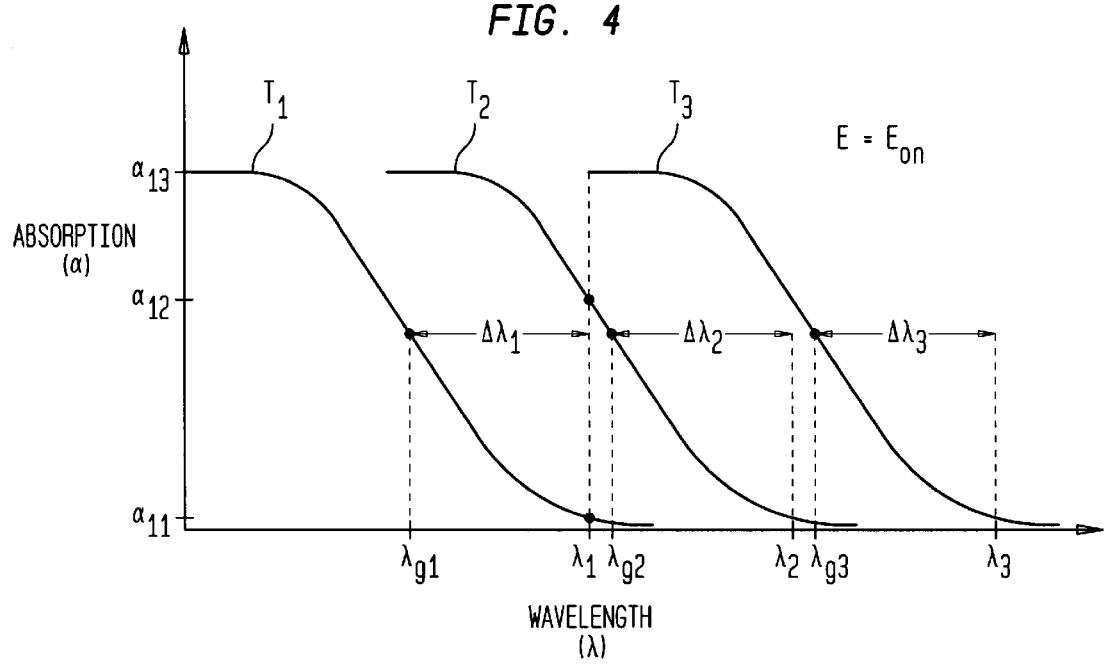
FIG. 4 is schematic graph of absorption vs. wavelength as a function of the temperature of an EA modulator.

The effect of temperature on the absorption characteristic of an EA modulator can be understood with reference to FIG. 4. As the temperature of an EA modulator is increased, for example from $T_1$ to $T_2$ to $T_3$, where $T_1>T_2>T_3$, the absorption characteristic shifts to the right to higher wavelengths. This shift in turn implies that the bandgap of the modulator is decreasing with increasing temperature since the wavelength $\lambda_g$ corresponding to the bandgap is increasing; i.e., $\lambda_{g3}>\lambda_{g2}>\lambda_{g1}$. It is apparent from FIG. 4 that, as the temperature changes, the absorption at a particular source wavelength also changes. Thus, at source wavelength $\lambda_L=\lambda_1$ the absorption increases from $\alpha_{11}$ to $\alpha_{12}$ to $\alpha_{13}$ as the temperature increases from $T_1$ to $T_2$ to $T_3$. Likewise, at a fixed modulator temperature as the source is tuned to shorter wavelengths, the transmitter will deliver lower output power, higher extinction ratios, and increased negative chirp.

In order to compensate for these changes, and to insure that these parameters will remain at the predetermined (e.g., optimum) values for each source wavelength, the temperature of the EA modulator is changed so that the detuning error is minimized. In the following discussion, it will be assumed that the predetermined detuning is the same for all channels for all values of i. The same concepts will apply in the more general case by using equations (1) and (2) instead of equations (4) and (5). In one embodiment, where the source wavelength can be temperature tuned independent of the temperature of the modulator, the detuning at each of the channel wavelengths are essentially the same; e.g., they satisfy equation (3) or, as shown in FIG. 4, $\Delta\lambda_1 \approx \Delta\lambda_2 \approx \Delta\lambda_3$. Strict equality is not required; the invention can tolerate some chirp as the source is tuned. For example, a variation of ±1 nm in the various offsets is acceptable for some applications. This embodiment is particularly useful in those transmitter designs that employ a WSL as the source.

Figure 5:
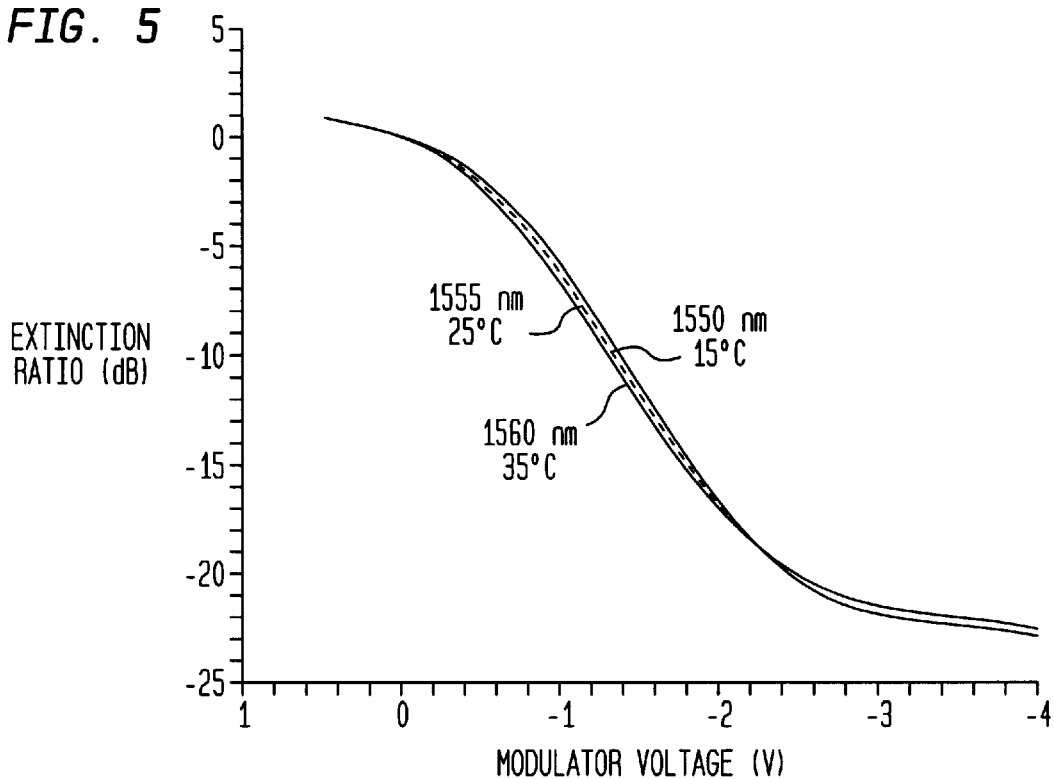
FIG. 5 is a graph of extinction ratio vs. bias voltage applied to an EA modulator for a 5 nm input wavelength spacing and a 10° C. difference between the modulator temperature at adjacent wavelengths of 1550 nm (at 15° C.), 1555 nm (at 25° C.) and 1560 nm (at 35° C.)
Figure 6:
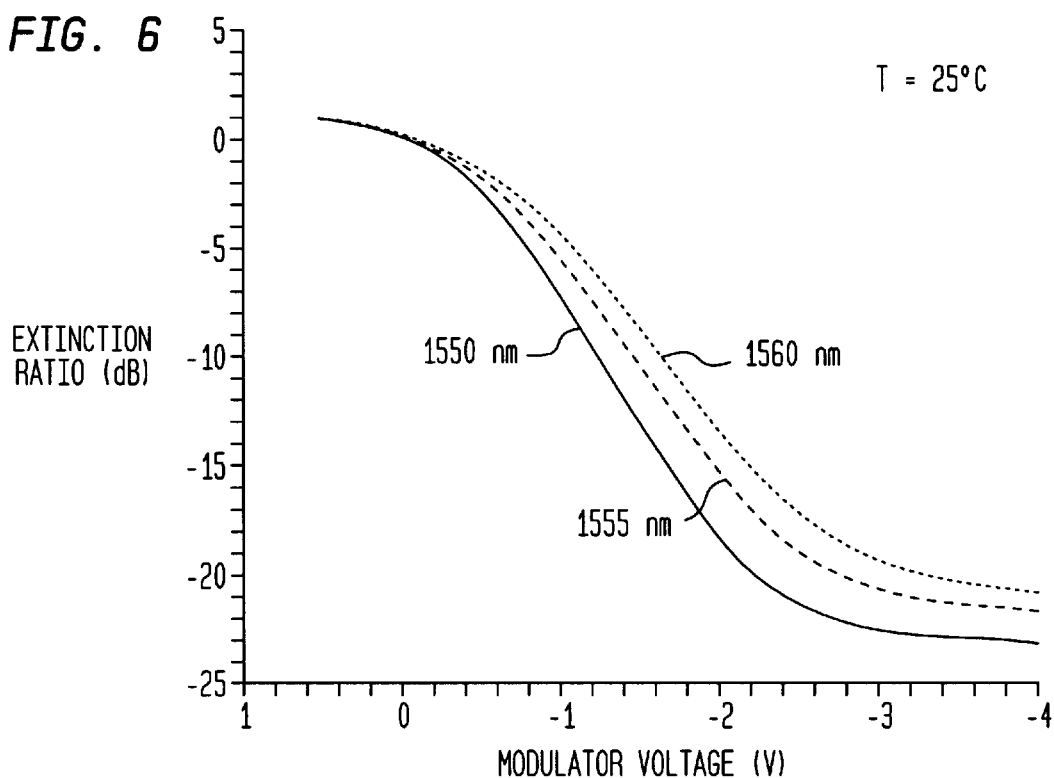
FIG. 6 is a graph, similar to FIG. 5, of extinction ratio vs. bias voltage applied to an EA modulator, but at the same temperature (25° C.) for all three wavelengths; i.e., as in the prior art, the modulator is not temperature tuned.

When this condition is satisfied, the family of extinction ratio vs. modulator voltage curves will essentially overlap one another, as shown in FIG. 5 (experimental results for a discrete EA modulator). This graph shows extinction ratio versus voltage applied to the modulator as a function of source wavelength and modulator temperature; i.e., 1550 nm, 1555 nm and 1560 nm at 15° C., 25° C. and 35° C., respectively. It is apparent that the three curves are essentially identical. Thus, adjusting the bandgap of the modulator (via its temperature) as the source wavelength is changed allows the desired detuning, as defined above, to be maintained. In contrast, if the modulator is kept at a constant temperature, the curves do not overlap, as shown in FIG. 6. Here, at a constant modulator temperature of 25° C., the extinction ratio changes as the source wavelength changes. For example, the change of about 5 dB at −2 V is undesirable in many applications.

However, in many practical applications of my invention, the EA modulator is either monolithically integrated on the same chip as the source (e.g., a WSL), or it is hybrid integrated on a common submount with high thermal conductivity between the source and the modulator, as shown in FIG. 1 (but without heaters 32 and 42). In both cases the modulator and the source will be at essentially the same temperature and they are not temperature tuned independent of one another. Consequently, the source wavelength, which is typically tightly controlled according to system specifications, will shift as the temperature of the modulator is changed. For example, the wavelength of a typical InP/InGaAsP laser that operates at nominal center wavelength of 1550 nm changes at the rate of 0.1 nm/° C., whereas the corresponding rate for an EA modulator fabricated from similar materials may be greater than (e.g., 0.5 nm/° C.), less than or equal to that of the laser.

Thus in order to make a broadband EA-modulated transmitter without sacrificing modulator performance, the source channel spacing $\Delta\lambda_i$ between any two adjacent channels at a fixed temperature should differ from the system channel spacing $\Delta\lambda_s$ between the corresponding two adjacent channels. In those embodiments where the source is a WSL laser, for example, the laser channel spacing is adjusted so that the combination of the level of current used to select a particular laser wavelength and the temperature change together yield the desired system channel spacing. Preferably the relationship between the laser and system channel spacings should satisfy equation (5). This channel spacing will insure that as the temperature is changed to keep the EA detuning constant, the laser wavelengths will correspond to predetermined system wavelengths; i.e., the laser wavelengths will line up on the system (e.g., ITU) grid.

For the case in which the source is a tunable laser, and where there is no temperature tuning of the individual channels, the implementation is as indicated above, and the relative EA detuning is nearly zero for all channels. Table I below illustrates this concept for a transmitter whose source comprises a tunable laser that covers N=7 channels spaced by 0.8 nm (about 100 GHz), assuming EA modulator and laser temperature coefficients of 0.5 nm/° C. and 0.1 nm/° C., respectively. The adjusted laser channel spacing is 0.64 nm, and the temperature difference is 1.6° C. per channel.

TABLE I

| Channel No. | Rel. Sys. Grid λ (nm) | Rel. Laser λ (nm) at 25° C. | Operating Temp. $T_{op}$ (° C.) | Rel. Detuning at $T_{op}$ |
|---|---|---|---|---|
| 1 | −2.4 | −1.92 | 20.2 | 0 |
| 2 | −1.6 | −1.28 | 21.8 | 0 |
| 3 | −0.8 | −0.64 | 23.4 | 0 |
| 4 | ±0.0 | ±0.00 | 25.0 | 0 |
| 5 | +0.8 | +0.64 | 26.6 | 0 |
| 6 | +1.6 | +1.28 | 28.2 | 0 |
| 7 | +2.4 | +1.92 | 29.8 | 0 |

On the other hand, if the source comprises an array of lasers (e.g., DFB lasers), in which each laser is capable of serving n<N channels (one at a time) by temperature tuning, the approach is similar to that described above, but because of the need to temperature tune each laser (e.g., via controller 36 of FIG. 1), the EA detuning can not be kept constant for all channels. However, the detuning range is significantly less than that not using my invention.

Figure 7:
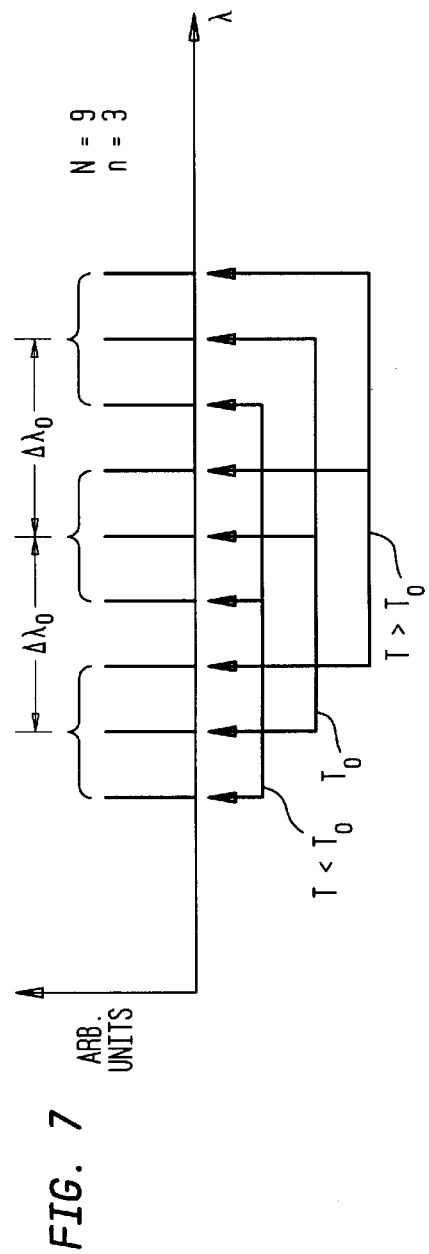
FIG. 7 is a schematic graph showing the channel wavelengths at different temperatures in accordance with another embodiment of my invention.

The concept is to find the best wavelength for each laser at the same temperature such that equation (3), with the substitution of nΔλs for Δλ$_s$, is satisfied. Table II below and FIG. 7 illustrate the concept for a transmitter whose source comprises an array of three DFB lasers. Each laser covers n=3 channels for a total of N=9 channels per transmitter. The channels are spaced by 0.4 nm (about 50 GHz). Table II (as well as Table III, infra) should be interpreted as follows. For the transmitter to deliver an output corresponding to the carrier for system channel #4, for example, laser #2 would be energized (turned on) and its operating temperature would be set to 21° C. On the other hand, for it to deliver an output corresponding to the carrier for channel #5, laser #2 would again be energized, but its temperature would be set to 25° C. Thus, by changing it operating temperature, each laser in the array of three can be set to one (at a time) of three different system channels. Note, only one laser in the array is energized (turned on) at a time.

When this embodiment of my invention is used, the desired wavelength spacing between lasers is about 0.96 nm, and the inter-laser temperature step is 2.4° C., obtained by the above-identified substitution. For the intermediate channels, the intra-laser temperature step is governed by the normal laser temperature tuning of 0.1 nm/° C., or 4.0° C. per channel. The result is that this embodiment of my invention has a maximum detuning range of ±1.6 (3.2) nm. The same methodology can be applied to a source that comprises a tunable laser in which the system channel spacing is smaller than the laser mode spacing, and temperature tuning is used to access the intermediate channel(s).

TABLE II

| Channel No. | Laser No. | Rel. Sys. Grid λ (nm) | Rel. Laser λ (nm) at 25° C. | Operating Temp. $T_{op}$ (° C.) | Rel. Detuning at $T_{op}$ |
|---|---|---|---|---|---|
| 1 | 1 | −1.6 | −0.96 | 18.6 | +1.6 |
| 2 | 1 | −1.2 | −0.96 | 22.6 | ±0.0 |
| 3 | 1 | −0.8 | −0.96 | 26.6 | −1.6 |
| 4 | 2 | −0.4 | ±0.00 | 21.0 | +1.6 |
| 5 | 2 | −0.0 | ±0.00 | 25.0 | ±0.0 |
| 6 | 2 | +0.4 | ±0.00 | 29.0 | −1.6 |
| 7 | 3 | +0.8 | +0.96 | 23.4 | +1.6 |
| 8 | 3 | +1.2 | +0.96 | 27.4 | ±0.0 |
| 9 | 3 | +1.6 | +0.96 | 31.4 | −1.6 |

In contrast, without use of my invention, each laser would be temperature tuned to cover n=3 channels, as above, but, as shown in Table III, would have a spacing between lasers of 1.2 nm and a maximum detuning range of ±2.8 (5.6) nm, as compared to a spacing of only 0.96 nm and a maximum detuning range only 3.2 nm for my invention. In addition, as the number of channels in the WDM system increases, the advantage realized in these parameters by use my invention is even greater. More specifically, in this embodiment of my invention the detuning range increases with n, but not N; thus, a source that comprises an array of 3 lasers will have the same detuning range as a source that comprises an array of 8 lasers, for example. In contrast, without the use of my invention, the detuning range increases with either n or N, or both.

TABLE III

| Channel No. | Laser No. | Rel. Sys. Grid λ (nm) | Rel. Laser λ (nm) at 25° C. | Operating Temp. $T_{op}$ (° C.) | Rel. Detuning at $T_{op}$ |
|---|---|---|---|---|---|
| 1 | 1 | −1.6 | −1.2 | 21 | +0.4 |
| 2 | 1 | −1.2 | −1.2 | 25 | −1.2 |
| 3 | 1 | −0.8 | −1.2 | 29 | −2.8 |
| 4 | 2 | −0.4 | ±0.0 | 21 | +1.6 |
| 5 | 2 | ±0.0 | ±0.0 | 25 | ±0.0 |
| 6 | 2 | +0.4 | ±0.0 | 29 | −1.6 |
| 7 | 3 | +0.8 | +1.2 | 21 | +2.8 |
| 8 | 3 | +1.2 | +1.2 | 25 | +1.2 |
| 9 | 3 | +1.6 | +1.2 | 29 | −0.4 |

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, the transmitter may also include a power monitor (e.g., a back face monitor photodiode) coupled to the drive circuit of the source for the purpose of controlling the power of the output beam (e.g., for the purpose of maintaining the output power constant). In addition, the transmitter may also include other elements disposed between the source and the modulator; for example, an optical isolator or an optical coupler. The latter may be used in conjunction with a photodetector to monitor the output power and wavelength of the source.

What is claimed is:

1. An optical transmitter for generating any one of N optical carrier signals for use in a system having $M \geq N$ optical channels each operating at a different wavelength $\lambda_s$ (s=1, 2 ... M), comprising:

at least one optical source for generating said carrier signals at any one of a multiplicity of N wavelengths $\lambda_i$ (i=1, 2 ... N), where ($1 \leq N \leq M$), a master controller for selecting a particular one of said wavelengths $\lambda_i$ at which said source operates, and an optical modulator for receiving the carrier signal corresponding to said selected wavelength $\lambda_i$ and for impressing information on said received signal, said modulator having a characteristic electronic bandgap corresponding to a wavelength $\lambda_g$, where $(\lambda_i - \lambda_g) = \Delta\lambda_i$, characterized in that said transmitter includes a second controller for minimizing the difference between the actual $\Delta\lambda_i$ and a predetermined value of $\Delta\lambda_i$ for all values of i.

2. The invention of claim 1 wherein the tuning of said source and said modulator are essentially independent of one another and wherein said second controller maintains the difference between the actual $\Delta\lambda_i$ and the predetermined $\Delta\lambda_i$ to be essentially zero for all values of i.

3. The invention of claim 2 wherein the predetermined values of $\Delta\lambda_i$ are essentially equal for all values of i.

4. The invention of claim 1 wherein the tuning of said source and said modulator are not independent of one another, and wherein the wavelength of said source is detuned from said channel wavelengths according to equation $$\Delta\lambda_{i+1}(T_i) - \Delta\lambda_i(T_i) = \Delta\lambda_s[1-(\partial\lambda_i/\partial T)(\partial T/\partial\lambda_g)] + (d\lambda_i/dT)(dT/d\lambda_g)(\Delta\lambda_{i+1} - \Delta\lambda_i).$$

5. The invention of claim 4 wherein the predetermined values of $\Delta\lambda_i$ are equal for all values of i, and wherein the wavelength of said source is detuned from said channel wavelengths according to equation $$\Delta\lambda_i = \Delta\lambda_s[1-(\partial\lambda_i/\partial T)(\partial T/\partial\lambda_g)].$$

6. The invention of claim 1 wherein said source comprises a tunable laser, said laser being tunable to each of said wavelengths $\lambda_i$.

7. The invention of claim 6 wherein said tunable laser comprises a tunable DBR laser.

8. The invention of claim 1 wherein said source comprises an array of tunable lasers.

9. The invention of claim 1 wherein said source comprises an array of single frequency lasers, each of said lasers being capable of generating a different one of said wavelengths $\lambda_i$.

10. The invention of claim 9 wherein said array of lasers comprises an array of DFB lasers.

11. The invention of claim 1 further including a second controller for controlling the temperature of at least one of said modulator and said source.

12. The invention of claim 11 wherein the temperature change $\Delta T$ of said modulator is maintained according to equation $$\Delta T = (dT/d\lambda_g)(\Delta\lambda_s + \Delta\lambda_i - \Delta\lambda_{i+1}).$$

13. The invention of claim 12 wherein said modulator comprises an electroabsorption modulator.

14. An optical transmitter for generating any one of N optical carrier signals for use in a system having $M \geq N$ optical channels each operating at a different wavelength $\lambda_s$ (s=1, 2 ... M) comprising:

a laser source for generating said carrier signals at any one of a multiplicity of N wavelengths $\lambda_i$ (i=1, 2 ... N), where ($1 \leq N \leq M$), a master controller for selecting a particular one of said wavelengths $\lambda_i$ at which said source operates, and an electroabsorption modulator for receiving the carrier signal corresponding to said selected wavelength $\lambda_i$ and for impressing information on said received signal, said modulator having a characteristic electronic bandgap corresponding to a wavelength $\lambda_g$, where $(\lambda_i - \lambda_g) = \Delta\lambda_i$, characterized in that said transmitter includes a second controller for minimizing the difference between the actual $\Delta\lambda_i$ and a predetermined value of $\Delta\lambda_i$ for all values of i.

15. The invention of claim 14 wherein the tuning of said source and said modulator are essentially independent of one another and wherein said second controller maintains the difference between the actual $\Delta\lambda_i$ and the predetermined $\Delta\lambda_i$ to be essentially zero for all values of i.

16. The invention of claim 15 wherein the predetermined values of $\Delta\lambda_i$ are essentially equal for all values of i.

17. The invention of claim 14 wherein the tuning of said source and said modulator are not independent of one another, and wherein the wavelength of said source is detuned from said channel wavelengths according to equation $$\Delta\lambda_{i+1}(T_i) - \Delta\lambda_i(T_i) = \Delta\lambda_s[1-(\partial\lambda_i/\partial T)(\partial T/\partial\lambda_g)] + (d\lambda_i/dT)(dT/d\lambda_g)(\Delta\lambda_{i+1} - \Delta\lambda_i).$$

18. The invention of claim 17 wherein the predetermined values of $\Delta\lambda_i$ are equal for all values of i, and wherein the wavelength of said source is detuned from said channel wavelengths according to equation $$\Delta\lambda_i = \Delta\lambda_s[1-(\partial\lambda_i/\partial T)(\partial T/\partial\lambda_g)]$$

* * * * *